United States Patent
Lee et al.

(10) Patent No.: US 12,150,336 B2
(45) Date of Patent: Nov. 19, 2024

(54) DISPLAY DEVICE

(71) Applicant: LG Display Co., Ltd., Seoul (KR)

(72) Inventors: Jungeun Lee, Paju-si (KR); Chulho Kim, Paju-si (KR); Namkook Kim, Paju-si (KR); Sungwoo Choi, Paju-si (KR); Hwankeon Lee, Paju-si (KR); Youngkyun Moon, Paju-si (KR); Jihun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 141 days.

(21) Appl. No.: 17/115,553

(22) Filed: Dec. 8, 2020

(65) Prior Publication Data

US 2021/0193968 A1    Jun. 24, 2021

(30) Foreign Application Priority Data

Dec. 19, 2019    (KR) .......................... 10-2019-0170619

(51) Int. Cl.
*H10K 50/858*    (2023.01)
*H10K 59/122*    (2023.01)
*H10K 59/38*    (2023.01)

(52) U.S. Cl.
CPC ......... *H10K 50/858* (2023.02); *H10K 59/122* (2023.02); *H10K 59/38* (2023.02)

(58) Field of Classification Search
CPC ............... H01L 51/5275; H01L 27/322; H01L 27/3246; H10K 50/86; H10K 50/865; H10K 50/858; H10K 59/38
See application file for complete search history.

(56) References Cited

U.S. PATENT DOCUMENTS

| | | |
|---|---|---|
| 8,446,093 B2 | 5/2013 | Kim et al. |
| 8,944,616 B2 | 2/2015 | Ichinose et al. |
| 9,112,183 B2 | 8/2015 | Ohta |
| 11,061,268 B2 | 7/2021 | Park et al. |
| 2002/0119384 A1 | 8/2002 | Koyama et al. |
| 2009/0302744 A1 | 12/2009 | Kim et al. |
| 2011/0084896 A1 | 4/2011 | Ito et al. |

(Continued)

FOREIGN PATENT DOCUMENTS

| | | |
|---|---|---|
| CN | 102044635 A | 5/2011 |
| CN | 102293053 A | 12/2011 |

(Continued)

OTHER PUBLICATIONS

Taiwan Intellectual Property Office, Office Action, TW Patent Application No. 109143937, Jul. 22, 2021, 12 pages.

(Continued)

*Primary Examiner* — Mariceli Santiago
(74) *Attorney, Agent, or Firm* — Fenwick & West LLP (57) ABSTRACT

The present disclosure relates to a display device. More particularly, the present disclosure relates to a display device capable of enhancing efficiency of light emitted from a light-emitting element. A display device according to an embodiment includes a substrate on which areas of pixels composed of multiple subpixels are arranged, a circuit element layer in which circuit elements constituting the multiple subpixels are provided, a light-emitting element layer in which light-emitting elements constituting the multiple subpixels are provided, and a lens placed corresponding to the light-emitting element.

18 Claims, 8 Drawing Sheets

(56) References Cited

U.S. PATENT DOCUMENTS

| | | | |
|---|---|---|---|
| 2012/0217521 A1 | 8/2012 | Ohta | |
| 2012/0218173 A1* | 8/2012 | Ohta | G02B 27/1046 345/76 |
| 2012/0268700 A1 | 10/2012 | Shu et al. | |
| 2013/0002690 A1 | 1/2013 | Ichinose et al. | |
| 2016/0064694 A1* | 3/2016 | Choi | H01L 51/5275 257/40 |
| 2016/0087018 A1 | 3/2016 | Shim et al. | |
| 2016/0218325 A1 | 7/2016 | Choi et al. | |
| 2019/0025634 A1 | 1/2019 | Park et al. | |
| 2019/0371866 A1 | 12/2019 | Kim et al. | |

FOREIGN PATENT DOCUMENTS

| | | | | |
|---|---|---|---|---|
| CN | 102707352 A | | 10/2012 | |
| CN | 102856349 A | | 1/2013 | |
| CN | 103891407 A | * | 6/2014 | G02B 5/20 |
| CN | 109283750 A | | 1/2019 | |
| CN | 110323354 A | | 10/2019 | |
| CN | 110544708 A | | 12/2019 | |
| JP | 2004317559 A | * | 11/2004 | |
| JP | 2013-026021 A | | 2/2013 | |
| KR | 10-2009-0126597 A | | 12/2009 | |
| KR | 10-1044193 B1 | | 6/2011 | |
| KR | 10-2013-0006728 A | | 1/2013 | |
| KR | 10-2019-0082085 A | | 7/2019 | |
| WO | WO-2013111696 A1 | * | 8/2013 | H01L 27/322 |
| WO | WO-2015174464 A1 | * | 11/2015 | G02B 5/20 |
| WO | WO-2019159641 A1 | * | 8/2019 | G02B 3/0012 |

OTHER PUBLICATIONS

China National Intellectual Property Administration, Office Action, Chinese Patent Application No. 202011435044.9, Aug. 12, 2023, 16 pages.

China National Intellectual Property Administration, Office Action, Chinese Patent Application No. 202011435044.9, Dec. 11, 2023, 19 pages.

Korean Intellectual Property Office, Office Action, Korean Patent Application No. 10-2019-0170619, Jun. 10, 2024, 10 pages.

* cited by examiner

DISPLAY DEVICE

CROSS-REFERENCE(S) TO RELATED APPLICATIONS

The present application claims priority to Republic of Korea Patent Application No. 10-2019-0170619 filed on Dec. 19, 2019, the entire contents of which is incorporated herein for all purposes by this reference.

BACKGROUND

Field of the Disclosure

The present disclosure relates to a display device. More particularly, the present disclosure relates to a display device capable of enhancing efficiency of light emitted from a light-emitting element.

Description

As information society has developed, demands for various types of display devices displaying images have increased. Display devices include a liquid crystal display (LCD) device, a plasma display panel (PDP), an organic light-emitting diode (OLED) display device, an electrophoretic display (ED) device, and the like.

The organic light-emitting diodes of the OLED display device are self-luminous elements that emit light by themselves, and the OLED display device has a high response rate, great luminous efficiency, great luminance, and great viewing angle. In particular, the organic light-emitting diodes may be formed even on a flexible plastic substrate. Compared to the plasma display panel or an inorganic electroluminescent (EL) display, the OLED display device may be driven with low voltage, has relatively low power consumption, and has excellent color.

Organic light-emitting diodes (OLEDs) are classified into a top emission type and a bottom emission type according to the direction in which light emitted from an emission layer is discharged.

In the case of the organic light-emitting diode of the bottom emission type, light emitted from the emission layer is discharged toward a substrate on which a thin-film transistor for driving an element is formed.

In contrast, in the case of the organic light-emitting diode of the top emission type, light emitted from the emission layer is discharged toward the opposite side of a substrate on which a thin-film transistor is formed. To this end, the organic light-emitting diode of the top emission type includes a reflective electrode as an anode, and a transmissive electrode transmitting light, as a cathode. Therefore, light emitted from the emission layer reflects off the reflective electrode and is discharged through the transmissive electrode. In order to enhance light efficiency, research to more efficiently extract light from the organic light-emitting diode of the OLED display device has been widely conducted.

SUMMARY

The objective of the present disclosure is to provide a display device capable of enhancing light efficiency.

According to an embodiment, there is provided a display device including a substrate on which areas of pixels composed of multiple subpixels are arranged, a circuit element layer in which circuit elements constituting the multiple subpixels are provided. a light-emitting element layer in which light-emitting elements constituting the multiple subpixels are provided, a color filter layer including multiple color filters, and a lens placed corresponding to the light-emitting element.

The light-emitting element may include a first electrode, an emission layer placed on the first electrode, and a second electrode placed on the emission layer.

The lens may wholly cover an emission area that is an area where the first electrode and the emission layer are in contact.

In addition, the lens may be in a convex shape.

The lens may be placed above the color filter layer.

The display device may further include an encapsulation layer formed on the second electrode.

The emission layer may be placed on the first electrode, being surrounded by a pixel definition film provided with an opening for exposing a part of the first electrode. The lens may be formed on the encapsulation layer in such a manner as to correspond to the opening of the pixel definition film.

The display device may further include a partition wall defining an area of the lens. The lens may be formed within the area formed by the partition wall.

According to another embodiment, there is provided a display device including a substrate on which areas of pixels composed of multiple subpixels are arranged, a circuit element layer in which circuit elements constituting the multiple subpixels are provided, a light-emitting element layer in which light-emitting elements constituting the multiple subpixels are provided, a lens placed corresponding to the pixel; and a partition wall defining an area of the lens, wherein the lens is formed within the area formed by the partition wall.

The light-emitting element may include a first electrode, an emission layer placed on the first electrode, and a second electrode placed on the emission layer. The display device may further include: a color filter layer including multiple color filters; and an encapsulation layer formed on the second electrode, wherein the color filter layer is formed above the encapsulation layer.

The lens may be placed above the color filter layer.

In addition, the lens may be formed with a predetermined step difference with the partition wall.

In addition, the lens may be formed by discharging a thermosetting solution with use of an inkjet printing method.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Hereinafter, embodiments of the present disclosure will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/or" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the present disclosure, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

Figure 1:
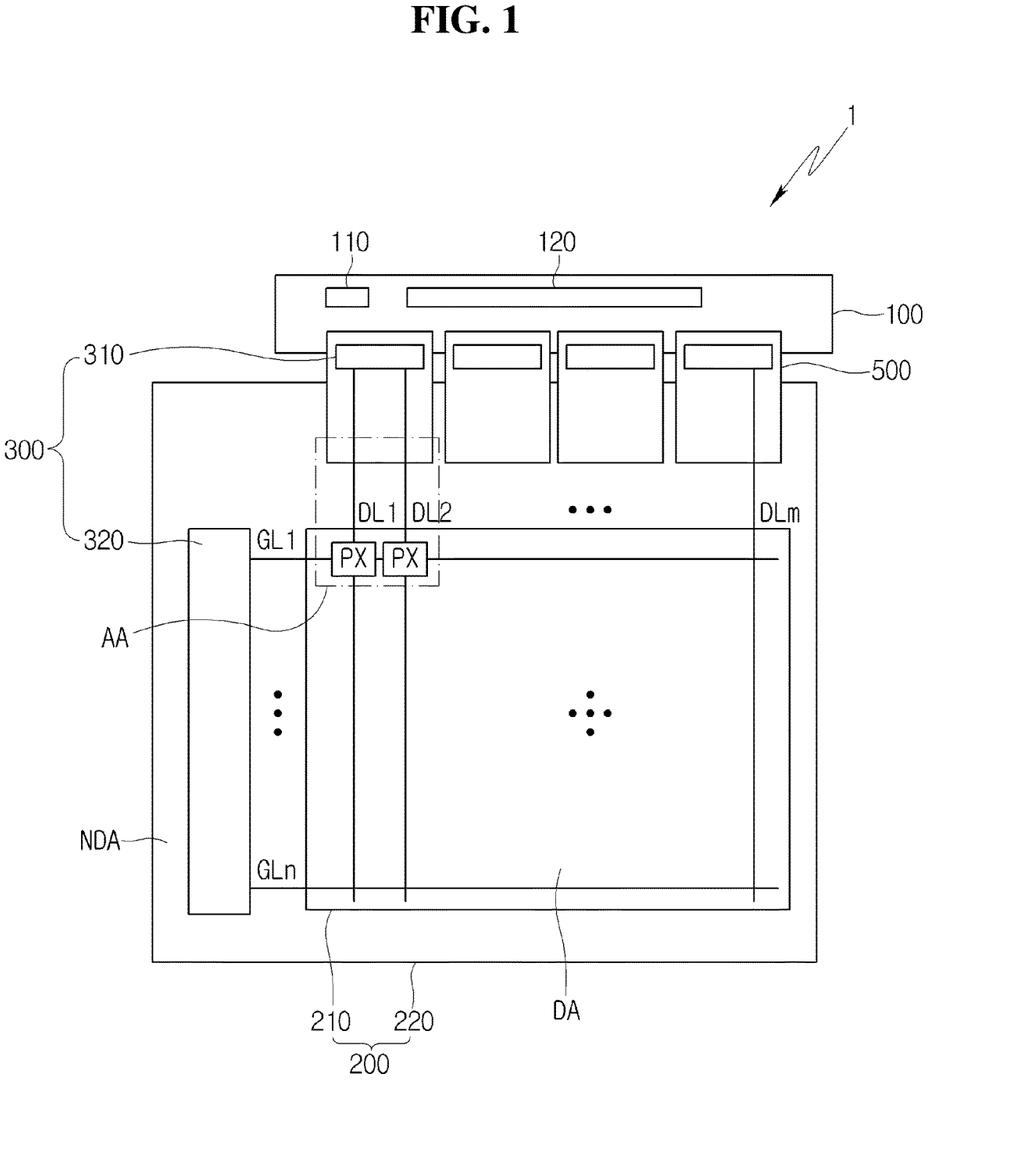
FIG. 1 is a block diagram showing a display device according to an embodiment.

FIG. 1 is a block diagram showing a display device according to an embodiment.

Referring to FIG. 1, a display device 1 includes a printed circuit board (PCB) 100, a display panel 200, and a driver 300.

The printed circuit board 100 may provide various control signals and/or power to the driver 300.

A timing controller 110 may process an image signal and the control signals to make the signals appropriate for an operation condition of the display panel 200, so that the timing controller 110 may generate and output image data, a gate driving control signal, a data driving control signal, and a power supply control signal.

A power supply 120 may generate a voltage to be supplied to pixels PXs and the driver 300, on the basis of the power supply control signal. The voltage may include, for example, a high-potential driving voltage, a low-potential driving voltage, and a voltage for driving the driver 300. The power supply 120 may provide the generated voltage to the pixels PXs and the driver 300.

The display panel 200 may include a lower substrate 220 and an upper substrate 210. The display panel 200 may be composed of a display area DA and a non-display area NDA. The display area DA is an area where the lower substrate 220 and the upper substrate 210 overlap each other, and the non-display area NDA is an area where the lower substrate 220 and the upper substrate 210 do not overlap each other. The display area DA is an area in which the pixels PXs are arranged, and may be referred to as an active area. The non-display area NDA may be placed around the display area DA.

On the lower substrate 220, gate lines GL1 to GLn, data lines DL1 to DLm, and the pixels PXs connected to the gate lines GL1 to GLn and the data lines DL1 to DLm may be formed, where n and m are natural numbers equal to or larger than 2. On the lower substrate 220, power lines may further be formed, but are not shown.

On the lower substrate 220, multiple data connection pads (not shown) may be provided. The data connection pads are not covered by an insulation layer and are exposed to the outside of the lower substrate 220, and are thus electrically connected to the printed circuit board 100, a data driver 310, and the like.

The driver 300 includes a gate driver 310, and the data driver 320.

The gate driver 320 may be connected to the pixels PXs in the display area DA through the multiple gate lines GL1 to GLn. The gate driver 320 may generate gate signals on the basis of the gate driving control signal supplied from the timing controller 110. The gate driver 320 may provide the generated gate signals to the pixels PXs through the multiple gate lines GL1 to GLn.

The data driver 310 may be connected to the pixels PXs in the display area DA through the multiple data lines DL1 to DLm. The data driver 310 may generate data signals on the basis of the image data and the data driving control signal output from the timing controller 110. The data driver 310 may provide the generated data signals to the pixels PXs through the multiple data lines DL1 to DLm.

In an embodiment, the data driver 310 may be manufactured as an integrated circuit chip (IC chip).

One side of a chip-on film is attached to the display panel 200 through an adhesive, or the like, and another side of the chip-on film is attached to the printed circuit board 100 through soldering, or the like. Through lead lines formed on a flexible film 500, elements (for example, the timing controller 110, and the power supply 120) on the printed circuit board 100, the data driver 310, and elements (for example, the gate driver 310, the pixels PXs, the gate lines GL1 to GLn, and the data lines DL1 to DLm) on the display panel 200 are electrically connected.

Each of the pixels PXs may be electrically connected to the corresponding gate line and the corresponding data line. Such pixels PXs may emit light with luminance corresponding to the gate signals and the data signals that are supplied through the gate lines GL1 to GLn and the data lines DL1 to DLm, respectively.

Each pixel PX may display any one among a first to a third color.

Figure 2:
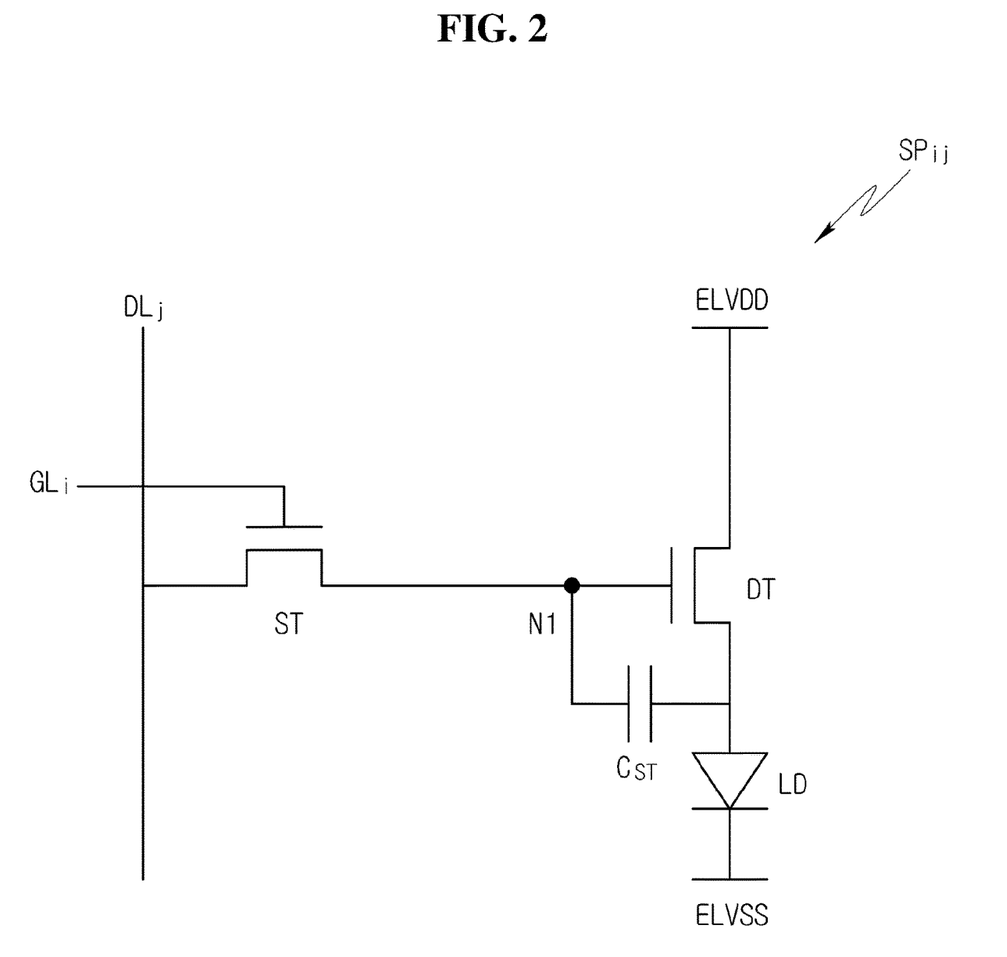
FIG. 2 is a circuit diagram showing an embodiment of a subpixel shown in FIG. 1.

FIG. 2 is a circuit diagram showing an embodiment of a subpixel shown in FIG. 1.

FIG. 2 shows, as an example, a subpixel SPij that is connected to an i-th gate line GLi and a j-th data line DLj, where i is a natural number equal to or smaller than n and equal to or larger than 1, and j is a natural number equal to or smaller than m and equal to or larger than 1.

Referring to FIG. 2, the subpixel SPij includes a switching transistor ST, a driving transistor DT, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th gate line GLi. The switching transistor ST is turned on when a gate signal at a gate-on level is applied through the i-th gate line GLi, and transmits a data signal applied through the j-th data line DLj, to the first node N1.

A first electrode of the storage capacitor Cst is electrically connected to the first node N1, and a second electrode of the storage capacitor Cst receives a high-potential driving voltage ELVDD. The storage capacitor Cst may be charged with a voltage corresponding to the difference between a voltage applied to the first node N1 and the high-potential driving voltage ELVDD.

A first electrode (for example, a source electrode) of the driving transistor DT receives the high-potential driving voltage ELVDD, and a second electrode (for example, a drain electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage applied to the gate electrode. A second electrode (for example, a cathode electrode) of the light-emitting element LD receives a low-potential driving voltage ELVSS.

The light-emitting element LD outputs light corresponding to the driving current. The light-emitting element LD may output light corresponding to any one among red, green, blue, and white colors. Hereinafter, the technical idea of this embodiment will be described with reference to an embodiment in which the light-emitting element LD is an organic light-emitting diode.

In this embodiment, the structure of the subpixels SPs is not limited to that shown in FIG. 2. According to an embodiment, the subpixel SPs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST and the driving transistor DT are NMOS transistors, but this embodiment is not limited thereto.

Figure 3:
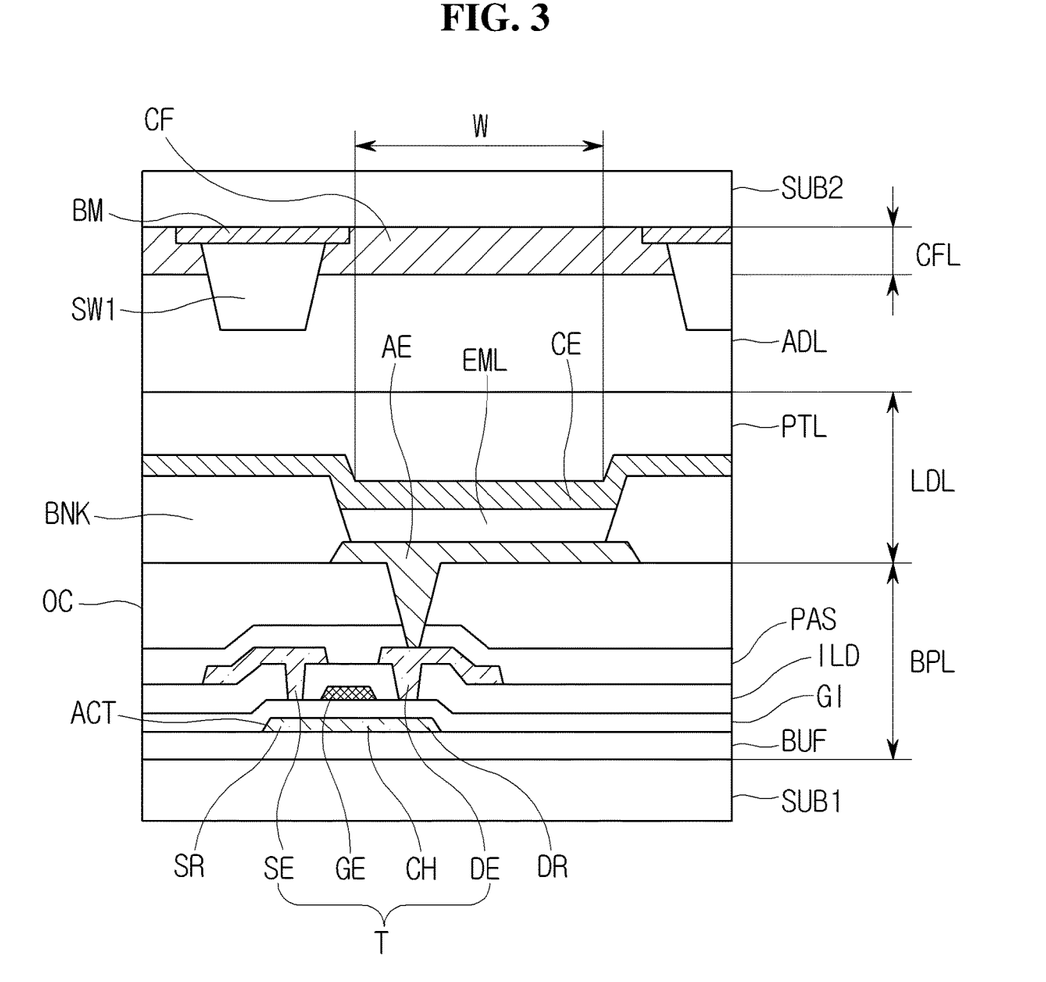
FIG. 3 is a cross-sectional view of an embodiment of a structure of one subpixel in an organic light-emitting diode display device.

FIG. 3 is a cross-sectional view of an embodiment of a structure of one subpixel in an organic light-emitting diode display device.

A display panel includes a first substrate SUB1, a circuit element layer BPL, a light-emitting element layer LDL, an adhesive layer ADL, a color filter layer CFL, and a second substrate SUB2.

The first substrate SUB1 is a base member of the display panel, and may be a light-transmissive substrate. The first substrate SUB1 may be a rigid substrate including glass or tempered glass, or may be a flexible substrate made of a plastic material. For example, the first substrate SUB1 may be made of a plastic material, such as polyimide, polyethylene terephthalate (PET), polyethylene naphthalate (PEN), polycarbonate (PC), and the like. However, the material of the first substrate SUB1 is not limited thereto.

On the first substrate SUB1, each area of a pixel PX composed of multiple subpixels SPs is defined. Each of the subpixels SPs includes at least one circuit element placed in the circuit element layer BPL, which will be described later, and the light-emitting element LD placed in the light-emitting element layer LDL. In an embodiment, each subpixel SP may be defined as further including the color filter layer CFL and a color filter CF placed in the color filter layer CFL. In an embodiment, according to the color of the color filter CF included in the subpixel SP, the color of light that the subpixel SP outputs may be determined.

The circuit element layer BPL is formed on the first substrate SUB1, and may include circuit elements (for example, a transistor T, a capacitor, and the like) and wires constituting the subpixel SP.

In an embodiment, a buffer layer BUF may be formed on the first substrate SUB1. The buffer layer BUF may prevent diffusion of ions or impurities from the first substrate SUB1, and may block moisture penetration. In addition, the buffer layer BUF may enhance the flatness of the surface of the first substrate SUB1. The buffer layer BUF may include an inorganic material, such as an oxide, a nitride, and the like, an organic material, or an organic-inorganic compound. The buffer layer BUF may be formed in a single-layer or multi-layer structure. For example, the buffer layer BUF may have a structure of three or more layers of silicon oxide and silicon nitride. In another embodiment, the buffer layer BUF may be omitted.

On the buffer layer BUF, an active pattern ACT may be formed. The active pattern ACT may be made of a silicon-based semiconductor material or an oxide-based semiconductor material. As the silicon-based semiconductor material, amorphous silicon or polycrystalline silicon may be used. As the oxide-based semiconductor material, a quaternary metal oxide, such as an indium tin gallium zinc oxide (InSnGaZnO), a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), a tin aluminum zinc oxide (SnAlZnO), a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), or an unitary metal oxide, such as an indium oxide (InO), a tin oxide (SnO), a zinc oxide(ZnO), may be used.

The active pattern ACT may include a source region SR and a drain region DR containing p-type or n-type impurities. and a channel CH formed between the source region SR and the drain region DR.

On the active pattern ACT, a gate insulation layer GI may be formed. The gate insulation layer GI may be a silicon oxide (SiOx), a silicon nitride (SiNx), or multiple layers thereof.

On the gate insulation layer GI, a gate electrode GE may be formed. The gate electrode GE may be placed at a position corresponding to the channel CH of the active pattern ACT. The gate electrode GE may be made of any one or an alloy selected from a group consisting of molybdenum (Mo), aluminum (Al), chromium (Cr), gold (Au), titanium (Ti), nickel (Ni), neodymium (Nd), and copper (Cu). In addition, the gate electrode GE may be multiple layers composed of any one or an alloy selected from a group consisting of molybdenum (Mo), aluminum (Al), chromium (Cr), gold (Au), titanium (Ti), nickel (Ni), neodymium (Nd), and copper (Cu). For example, the gate electrode GE may be a double layer of molybdenum and aluminum-neodymium, or molybdenum and aluminum.

On the gate electrode GE, an interlayer insulation layer ILD may be formed. The interlayer insulation layer ILD may be composed of an inorganic material, and may be composed of a material that is the same or different from that of the gate insulation layer GI. For example, the interlayer insulation layer ILD may be a silicon oxide (SiOx) film, a silicon nitride (SiNx) film, or multiple layers thereof.

On the interlayer insulation layer ILD, a source electrode SE and a drain electrode DE may be formed. The source electrode SE and the drain electrode DE may be connected to the source region SR and the drain region DR of the active pattern ACT, respectively, through contact holes penetrating through the interlayer insulation layer ILD and the gate insulation layer GI.

The source electrode SE and the drain electrode DE may be formed as a single layer or multiple layers composed of any one or an alloy selected from a group consisting of molybdenum (Mo), aluminum (Al), chromium (Cr), gold (Au), titanium (Ti), nickel (Ni), neodymium (Nd), and copper (Cu). When the source electrode SE and the drain electrode DE are multiple layers, they may be composed of a double layer of molybdenum and aluminum-neodymium, or a triple layer of titanium and aluminum and titanium; molybdenum and aluminum and molybdenum; or molybdenum and aluminum-neodymium and molybdenum.

The source electrode SE, the drain electrode DE, the gate electrode GE, and the active pattern ACT corresponding thereto may constitute the transistor T. The transistor T may be, for example, the driving transistor DT or the switching transistor ST. FIG. 3 shows, as an example, the driving transistor DT of which the drain electrode DE is connected to a first electrode AE of the light-emitting element LD.

On the source electrode SE and the drain electrode DE, a passivation layer PAS may be formed. The passivation layer PAS is an insulation layer for protecting the lower elements, and may be made of an inorganic material or an organic material. The passivation layer PAS may be, for example, a silicon oxide (SiOx) film, a silicon nitride (SiNx) film, or multiple layers thereof. In an embodiment, the passivation layer PAS may have a multi-layer structure in which an inorganic layer and an organic layer are stacked in order.

On the passivation layer PAS, an overcoat layer OC may be formed. The overcoat layer OC may be a planarizing film for reducing the step difference in the lower structure, and may be composed of an organic material such as polyimide, benzocyclobutene series resin, acrylate, and the like.

FIG. 3 shows the transistor T in a top-gate structure in which the gate electrode GE is formed above the active pattern ACT, but the technical idea of this embodiment is not limited thereto. That is, in various embodiments, the transistor T may be formed in a bottom-gate structure in which the gate electrode GE is formed below the active pattern ACT.

In the circuit element layer BPL, circuit elements such as various signal wires and capacitors that are not shown may be further formed. The signal wires may include, for example, a gate line, a data line, and the like described with reference to FIGS. 1 and 2.

The light-emitting element layer LDL is formed on the overcoat layer OC, and includes light-emitting elements LDs. The light-emitting element LD includes the first electrode AE, the emission layer EML, and a second electrode CE. The first electrode AE may be an anode electrode, and the second electrode CE may be a cathode electrode.

At least one among the first electrode AE and the second electrode CE may be a transmissive electrode and at least another one may be a reflective electrode.

For example, in the case where the light-emitting element LD is a bottom emission type, the first electrode AE may be a transmissive electrode, and the second electrode CE may be a reflective electrode. In contrast, in the case where the light-emitting element LD is a top emission type, the first electrode AE may be a reflective electrode, and the second electrode CE may be a transmissive electrode. In another example, in the case where the light-emitting element LD is a dual emission type, both the first electrode AE and the second electrode CE may be transmissive electrodes.

In the case of the top emission type, light emitted from the emission layer may be subjected to total reflection back inside due to the difference in refractive index between the cathode electrode having a high refractive index and a structure placed on the cathode electrode, for example, a protective film. The light subjected to total reflection inward is trapped inside the organic light-emitting diode display device and may deteriorate light efficiency. Hereinafter, taking the case where the light-emitting element LD is a top emission type as an example, a detailed configuration of the light-emitting element LD will be described.

The first electrode AE is formed on the overcoat layer OC. The first electrode AE is connected to the drain electrode DE of the transistor T through the via hole penetrating through the overcoat layer OC and the passivation layer PAS. The first electrode AE may be composed of a transparent conductive material, such as indium tin oxide (ITO), indium zinc oxide (IZO), zinc oxide (ZnO), or the like. In the case where the first electrode AE is a reflective electrode, the first electrode AE may include a reflective layer. The reflective layer may be made of aluminum (Al), copper (Cu), silver (Ag), nickel (Ni), or an alloy thereof. In an embodiment, the reflective layer may be composed of an alloy (APC) of silver, palladium, and copper.

On the overcoat layer OC, a bank BNK may be further formed. The bank BNK may be a pixel definition film defining an emission area EA of the subpixel SP. Within the display area DA, an area except the emission area EA may be defined as a non-emission area. The bank BNK may be made of an organic film such as an acryl resin, an epoxy resin, a phenolic resin, a polyamide resin, a polyimide resin, and the like.

The bank BNK is formed in such a manner as to cover a partial area (for example, a part of the edge) of the first electrode AE. The exposed area of the first electrode AE which is not covered by the bank BNK is defined as the emission area EA of the subpixel SP. In the emission area EA, the first electrode AE, the emission layer EML, and the second electrode CE are stacked in such a manner as to be directly in contact with each other.

On the first electrode AE and the bank BNK, the emission layer EML is formed. The emission layer EML may have a multi-layer thin-film structure including a light generation layer. Herein, the color of light generated by the light generation layer may be white, but is not limited thereto.

The emission layer EML may include a hole transport layer (HTL), an organic emission layer, and an electron transport layer (ETL). The hole transport layer smoothly transports holes injected from the first electrode AE, to the organic emission layer. The organic emission layer may be made of an organic material including a phosphorescent or fluorescent material. The electron transport layer smoothly transports electrons injected from the second electrode CE, to the organic emission layer. In addition to the hole transport layer, the organic emission layer, and the electron transport layer, the emission layer (EML) may further include a hole injection layer (HIL), a hole blocking layer (HBL), an electron injection layer (EIL), and an electron blocking layer (EBL).

The emission layer EML may be formed in a tandem structure of two or more stacks. In this case, each of the stacks may include the hole transport layer, the organic emission layer, and the electron transport layer. In the case where the emission layer EML is formed in the tandem structure of two or more stacks, a charge generation layer is formed between the stacks. The charge generation layer may include an n-type charge generation layer and a p-type charge generation layer. The n-type charge generation layer is positioned near the lower stack. The p-type charge generation layer is formed on the n-type charge generation layer and is thus positioned near the upper stack. The n-type charge generation layer injects electrons into the lower stack, and the p-type charge generation layer injects holes into the upper stack. The n-type charge generation layer may be an organic layer obtained by doping, into an organic host material having electron transport capability, alkali metals, such as lithium (Li), sodium (Na), potassium (K), or cesium (Cs), or alkaline earth metals, such as magnesium (Mg), strontium (Sr), barium (Ba), or radium (Ra). The p-type charge generation layer may be an organic layer obtained by doping dopants into an organic host material having hole transport capability.

The second electrode CE is formed on the emission layer EML. The second electrode CE may be formed in such a manner as to cover the emission layer EML. The second electrode CE may be made of a transparent conductive material (TCO) capable of transmitting light, or a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In the case where the second electrode CE is made of the semi-transmissive conductive material, light emission efficiency may be increased due to a micro cavity.

On the second electrode CE, an encapsulation layer PTL may be formed. The encapsulation layer PTL prevents external moisture from penetrating into the emission layer EML. The encapsulation layer PTL may be made of an inorganic insulation material or may be formed in a structure in which an inorganic insulation material and an organic insulation material are alternately stacked, but is not necessarily limited thereto.

The adhesive layer ADL bonds the first substrate SUB1 and the second substrate SUB2. The adhesive layer ADL is formed between the encapsulation layer PTL above the first substrate SUB1 and a black matrix BM under the second substrate SUB2, and is formed between the encapsulation layer PTL above the first substrate SUB1 and the color filter layer CFL under the second substrate SUB2.

The adhesive layer ADL may be made of a transparent and adhesive material, for example, a resin, epoxy, acryl material, or the like. In an embodiment, the adhesive layer ADL may include a material that prevents external moisture from penetrating.

The second substrate SUB2 is a base member of the display panel and faces the first substrate SUB1. The second substrate SUB2 may form a surface on which an image is displayed. The second substrate SUB2 may be composed of the same material as the first substrate SUB1.

Under the second substrate SUB2, the color filter layer CFL is formed. The color filter layer CFL includes the black matrix BM, a first partition wall SW1, and multiple color filters CFs.

The black matrix BM is formed at the inner surface of the second substrate SUB2, that is, the lower surface facing the first substrate SUB1. The black matrix BM defines the area of the subpixels SPs, and prevents light leakage from occurring at boundaries of the subpixels SPs. To this end, the black matrix BM may be composed of a photosensitive organic material. The black matrix BM may have a structure corresponding to the bank BNK described above.

The first partition wall SW1 is formed in at least one area under the black matrix BM, and defines areas of the color filters CFs. That is, the first partition wall SW1 may be provided at the boundary between the color filters CFs of different colors.

The first partition wall SW1 may serve as a dam that prevents color filter inks from mixing when the color filters CFs described later are generated by a solution process using inkjet equipment. To this end, the first partition wall SW1 may include a hydrophobic polymer material. The hydrophobic polymer material may include, for example, any one or a mixture of at least two selected from a group consisting of polyimide, styrene, methyl mathacrylate, and polytetrafluoroethylene that contain fluorine (F).

At least a part of the surface of the first partition wall SW1 may be hydrophobic. For example, the first partition wall SW1 may be formed through a photolithography process after applying a solution containing a hydrophobic material such as fluorine (F), on an organic insulation material. Due the light emitted during the photolithography process, a hydrophobic material, such as fluorine, may move to the top of the first partition wall SW1, and accordingly, the top surface of the first partition wall SW1 has a hydrophobic property and the remaining portion may have a hydrophilic property.

In various embodiments, the first partition wall SW1 may include a positive-type or negative-type photosensitive composition. The photosensitive composition may include, for example, a binder resin, a polymerizable monomer, a polymerizable oligomer, a pigment, a dispersant, a photoinitiator, and the like.

Figure 5:
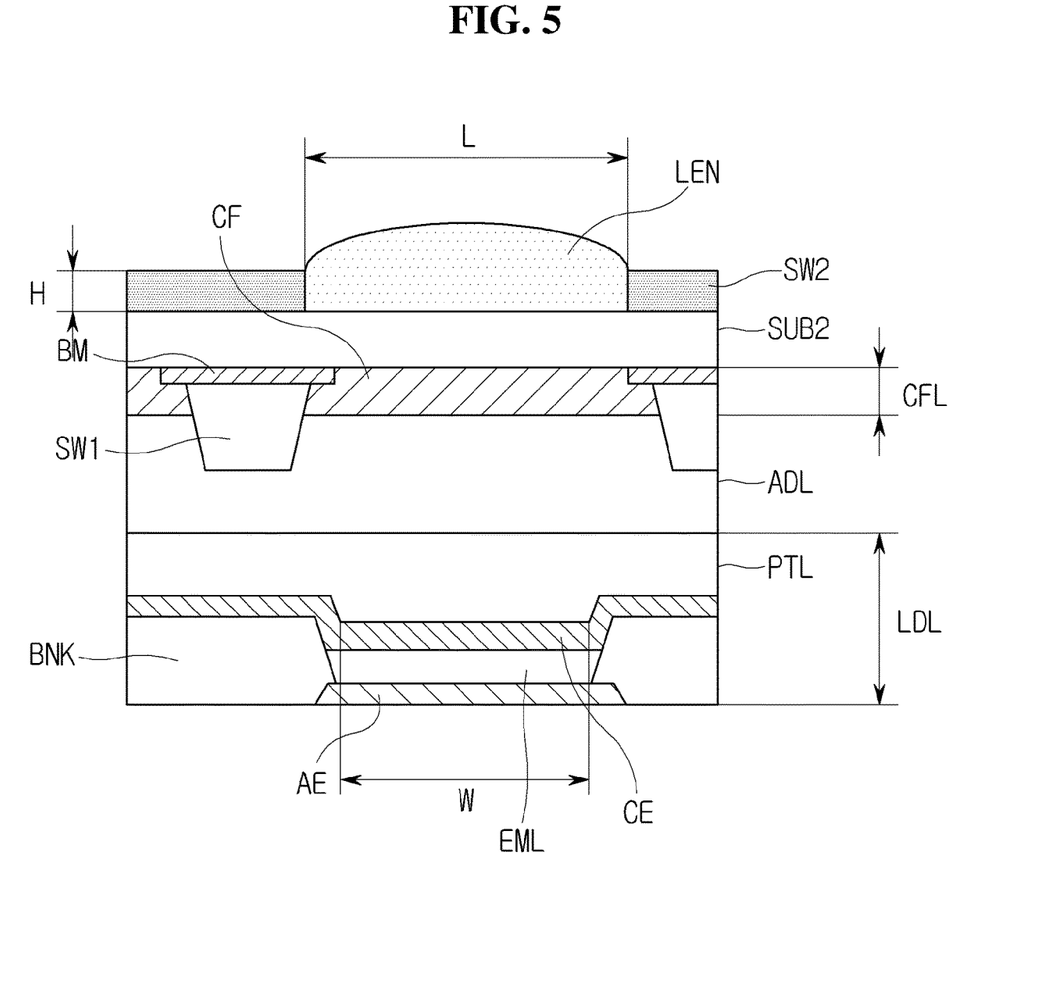
FIG. 5 is a cross-sectional view of an organic light-emitting diode display device according to a second embodiment of the present disclosure.

The width of the first partition wall SW1 may be formed in such a manner as to be the same or different from the width of the black matrix BM. For example, the width of the first partition wall SW1 may be formed in such a manner as to be narrow than the width of the black matrix BM, as shown in FIGS. 3 and 5. In an embodiment, the first partition wall SW1 may have a tapered shape in which the width thereof becomes narrower as it gets to be away from the surface of the black matrix BM. However, this embodiment is not limited thereto.

The color filters CFs may be provided within an area surrounded by the first partition wall SW1. The color filters CFs may cover the black matrix BM where the first partition wall SW1 is not formed.

First Embodiment

Figure 4A:
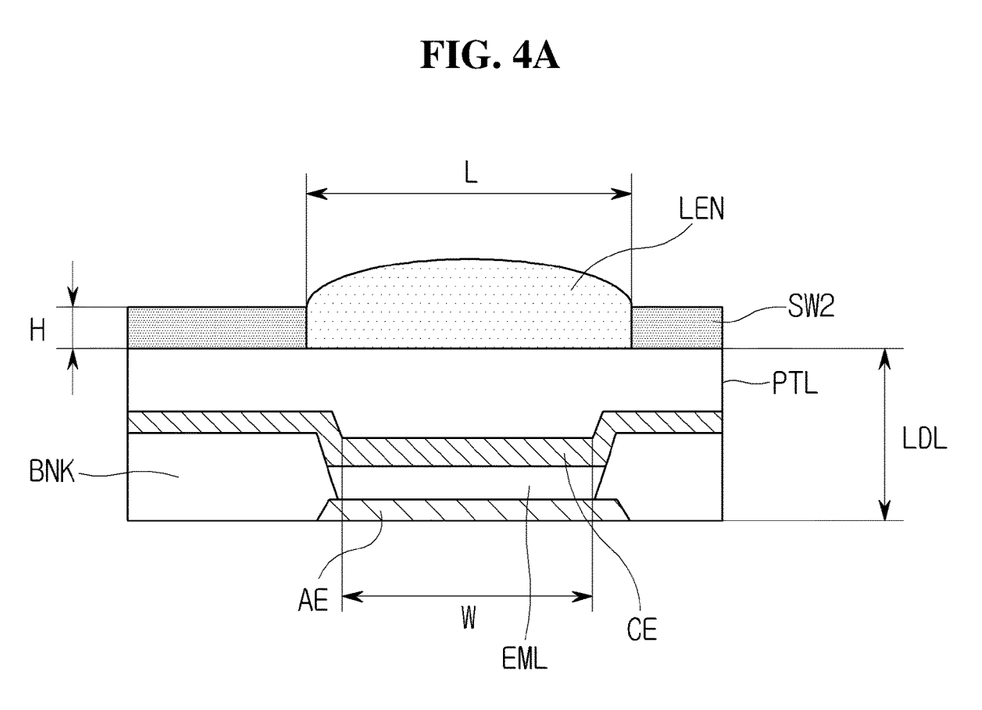
FIGS. 4A and 4B are cross-sectional views of an organic light-emitting diode display device according to a first embodiment of the present disclosure.
Figure 4B:
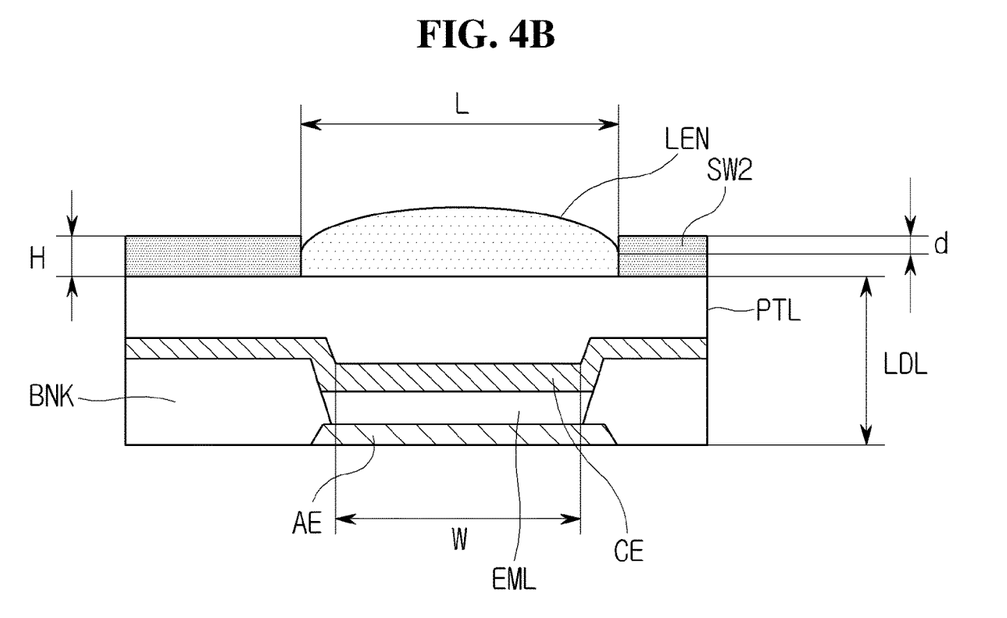

FIGS. 4A and 4B are cross-sectional views of an organic light-emitting diode display device according to a first embodiment of the present disclosure. FIG. 4A is a cross-sectional view of an organic light-emitting diode display device according to embodiment 1-1 of the present disclosure. FIG. 4B is a cross-sectional view of an organic light-emitting diode display device according to embodiment 1-2 of the present disclosure.

With reference to FIGS. 4A and 4B, the common features of embodiments 1-1 and 1-2 will be described first.

Referring to FIGS. 4A and 4B, in the organic light-emitting diode display device according to the first embodiment of the present disclosure, a lens LEN is placed on the light-emitting element layer LDL in which light-emitting elements are provided.

The light-emitting element layer LDL includes the light-emitting elements LDs. The light-emitting element LD includes the first electrode AE, the emission layer EML, and a second electrode CE. The first electrode AE may be an anode electrode, and the second electrode CE may be a cathode electrode.

On the second electrode CE, the encapsulation layer PTL may be formed. The encapsulation layer PTL prevents external moisture from penetrating into the emission layer EML.

The lens LEN is provided on the encapsulation layer PTL.

Regarding the lens LEN of the present disclosure in detail, the lens LEN is placed corresponding to the light-emitting element LD in the light-emitting element layer LDL. The light-emitting element LD includes the first electrode AE, the emission layer EML placed on the first electrode AE, and the second electrode CE placed on the emission layer EML. The light-emitting elements LDs are regularly arranged on a substrate, and also the lenses LENs which are placed corresponding to the light-emitting elements LDs are regularly arranged on the substrate. The lens LEN is placed in such a manner as to cover the whole emission area EA which is an area where the first electrode AE and the emission layer EML are in contact, so that the entire light emitted from the emission layer EML is held within the lens LEN.

The lens LEN of the present disclosure is intended to enhance light extraction efficiency by refracting the light emitted from the emission layer EML upward. The shape of the lens LEN is a convex shape, preferably. The lens LEN is in size to cover the emission area EA. Specifically, a diameter L of the lens is longer than a width W1 of the emission area EA so that the lens LEN covers the whole emission area EA. Herein, the width W1 of the emission area refers to the longest width in the emission area EA.

The lens LEN may be formed by discharging a lens solution containing a lens material on the encapsulation layer PTL with use of an inkjet printing method or a nozzle printing method, and by drying the lens solution. The lens solution may be composed of a photocurable or thermosetting solution.

On the encapsulation layer PTL, a second partition wall SW2 is formed. The second partition wall SW2 may be formed as the overcoat layer OC, and may be composed of an organic material such as polyimide, benzocyclobutene series resin, acrylate, and the like. The second partition wall SW2 may be formed in a pattern through a photolithography process using a photomask.

The second partition wall SW2 formed on the encapsulation layer PTL may define an area where the lens is formed. The second partition wall SW2 may be placed at a potion corresponding to the position of the bank BNK that serves as the pixel definition film defining the emission area EA of subpixels SPs. The second partition wall SW2 enables the lens solution to be evenly applied to areas of multiple subpixels SPs during a solution process using an inkjet printing method or a nozzle printing method.

According to a height H of the second partition wall SW2, the shapes of the lens LEN formed by the solution process may vary. For example, when the height H of the second partition wall SW2 is high with respect to the amount of the lens solution discharged for the solution process, the lens LEN is formed in a concave shape. In contrast, when the height H of the second partition wall SW2 is low, the lens LEN is formed in a convex shape.

Embodiment 1-2

The lens LEN may be formed by discharging a lens solution containing a lens material on the encapsulation layer PTL with use of an inkjet printing method or a nozzle printing method, and by drying the lens solution.

In embodiment 1-2, the lens LEN may be composed of a thermosetting material. Regarding the lens LEN, the lens solution is discharged on the encapsulation layer PTL by using the inkjet printing method or the nozzle printing method. Regarding a heat-drying process of the lens solution discharged on the encapsulation layer PTL, due to evaporation of the lens solution during the heat-drying process, the second partition wall SW2 and the thermoset lens may have a predetermined step difference as shown in FIG. 4B.

Second Embodiment

FIG. 5 is a cross-sectional view of an organic light-emitting diode display device according to a second embodiment.

Referring to FIG. 5, in the organic light-emitting diode display device according to the second embodiment of the present disclosure, the color filter layer CFL is placed above the light-emitting element layer LDL in which light-emitting elements are provided. In addition, the lens LEN is placed above the color filter layer CFL.

In the second embodiment, one or more subpixels SPs may further include the color filter layer CFL and a color filter CF placed in the color filter layer CFL. According to the color of the color filter CF included in the subpixel SP, the color of light that the subpixel SP outputs may be determined.

The color filter layer CFL may include the adhesive layer ADL. The adhesive layer ADL is formed between the encapsulation layer PTL and the black matrix BM, and is formed between the encapsulation layer PTL and the color filter layer CFL.

The adhesive layer ADL may be made of a transparent and adhesive material, for example, a resin, epoxy, acryl material, or the like. In an embodiment, the adhesive layer ADL may include a material that prevents external moisture from penetrating.

Third Embodiment

Figure 6:
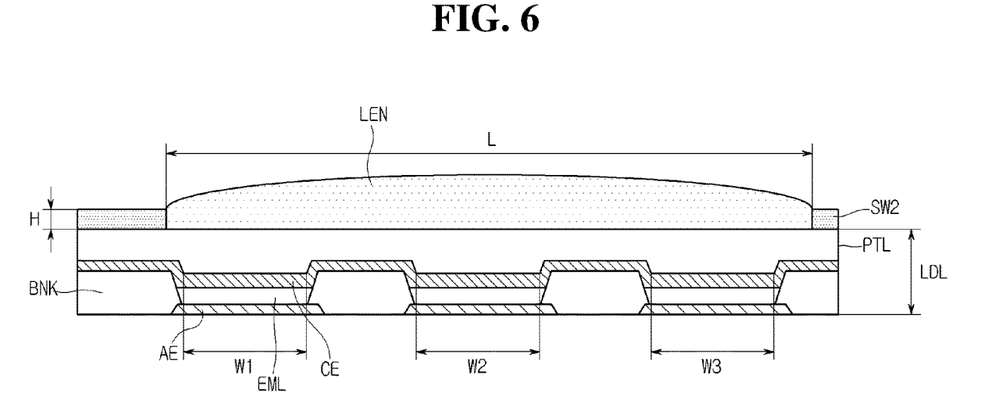
FIG. 6 is a cross-sectional view of an organic light-emitting diode display device according to a third embodiment of the present disclosure.

FIG. 6 is a cross-sectional view of an organic light-emitting diode display device according to a third embodiment.

Referring to FIG. 6, in the organic light-emitting diode display device according to the third embodiment, the lens LEN is placed on the light-emitting element layer LDL in which light-emitting elements are provided.

The characteristic of the third embodiment is that the lens LEN is not placed corresponding to the light-emitting element included in the subpixel SP, but is placed corresponding to one pixel PX. The pixel PX refers to a smallest unit that composes a display image. In FIG. 6, one pixel PX is composed of three subpixels SPs. One pixel PX may be composed of three subpixels SPs displaying red, green, and blue values that are three primary colors of light. However, implementation of three subpixels SPs in red (R), green (G), and blue (B) is merely an example. Depending on a method of implementing the pixel PX, four subpixels SP in red (R), green (G), blue (B), and white (W) may be implemented.

The lens LEN of the present disclosure is intended to enhance light extraction efficiency by refracting the light emitted from the emission layer EML upward. The shape of the lens LEN is a convex shape, preferably. The lens LEN is in size to wholly cover one pixel. Specifically, a diameter L of the lens is longer than a width W2 of one pixel whole so that the lens LEN wholly covers the one pixel.

In the case of placing the lens LEN on a per-pixel (PX) basis, manufacturing is easy, compared to the case of placing the lens LEN on a per-subpixel (SP) basis.

In particular, in the case of forming the lens LEN through the solution process using inkjet equipment, as the size of the subpixel SP become smaller in a high-resolution display device, there is a limit in forming the lens LEN through the solution process. As the size of the lens LEN decreases, the size of the nozzle of the inkjet equipment needs to be reduced. However, there is a limit in reducing the size of the nozzle. In addition, when forming the lens LEN in small size by using the inkjet equipment, the lens LEN may be mixed with a lens LEN placed at a nearby subpixel SP. Further, as the size of the subpixel decreases, the technical difficulty of the solution process increases.

Fourth Embodiment

Figure 7:
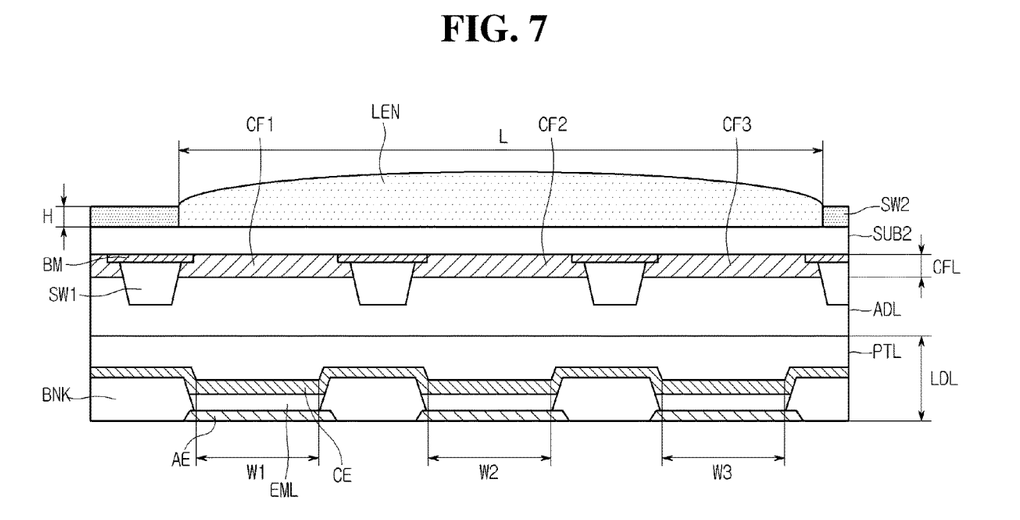
FIG. 7 is a cross-sectional view of an organic light-emitting diode display device according to a fourth embodiment of the present disclosure.

FIG. 7 is a cross-sectional view of an organic light-emitting diode display device according to a fourth embodiment.

Similarly to the third embodiment, the characteristic of the fourth embodiment is that the lens LEN is placed corresponding to the pixel PX. However, there is a difference from the third embodiment in that the display device of the fourth embodiment includes the color filter layer CFL.

The color filter layer CFL including multiple color filters is formed above the encapsulation layer PTL.

The color filters CFs may include a first-color color filter CF1, a second-color color filter CF2, and a third-color color filter CF3 that are formed in a pattern corresponding to the subpixels SPs. Herein, the first to the third color correspond to the colors of the first to the third subpixel (R, G, B), respectively. For example, the first color is red, the second color is green, and the third color is blue. The first-color color filter CF1 is placed above multiple first subpixels (R) arranged nearby. The second-color color filter CF2 is placed above multiple second subpixels (G) arranged nearby. The third-color color filter CF3 may be placed above multiple third subpixels (B) arranged nearby.

As described above, the display device according to the various embodiments of the present disclosure may enhance light efficiency. In addition, according to the various embodiments, it is possible to prevent external light entered from the outside of the display device from being reflected.

It should be understood that the embodiments described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

Although the disclosure has been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a substrate on which areas of pixels composed of multiple subpixels are arranged;
a circuit element layer in which circuit elements constituting the multiple subpixels are provided;
a light-emitting element layer in which light-emitting elements constituting the multiple subpixels are provided;
an adhesive layer on the light-emitting layer;
a lens placed corresponding to a light-emitting element;
a partition wall defining an area of the lens,
wherein the lens is formed within the area formed by the partition wall,
wherein the lens is formed with a predetermined step difference with the partition wall,
wherein the surface height of the lens is higher than a surface height of the partition wall;
a color filter layer between the lens and the light-emitting element layer, the color filter layer including:
multiple color filters including a color filter above the light-emitting element, and wherein the color filter layer includes a second partition wall between the color filter and another color filter that overlaps the partition wall and a black matrix on the second partition wall, wherein the black matrix protrudes further than the second partition wall such that a lower surface of the black matrix is exposed, and wherein the color filter contacts the lower surface of the black matrix and directly contacts the adhesive layer,
wherein a top surface of the second partition wall has a hydrophobic property and a remaining portion has a hydrophilic property, and wherein a lower part of the partition wall is in contact with the lens, and an upper part of the partition wall is exposed by the lens; and
a second substrate between the color filter layer and the lens.

2. The display device of claim 1, wherein the lens is placed above the color filter layer.

3. The display device of claim 1, wherein the light-emitting element comprises:
a first electrode;
an emission layer placed on the first electrode; and
a second electrode placed on the emission layer.

4. The display device of claim 3, wherein the lens wholly covers an emission area that is an area where the first electrode and the emission layer are in contact.

5. The display device of claim 3, further comprising:
an encapsulation layer formed on the second electrode.

6. The display device of claim 5, wherein the emission layer is surrounded by a pixel definition film provided with an opening for exposing a part of the first electrode, and
the lens is formed on the second substrate to correspond to the opening of the pixel definition film.

7. The display device of claim 1, wherein the lens is in a convex shape.

8. A display device comprising:
a substrate on which areas of pixels composed of multiple subpixels are arranged;
a circuit element layer in which circuit elements constituting the multiple subpixels are provided;

a light-emitting element layer in which light-emitting elements constituting the multiple subpixels are provided;

an adhesive layer on the light-emitting element layer;

a lens placed corresponding to a pixel; and a partition wall defining an area of the lens, wherein the lens is formed within the area formed by the partition wall, wherein the lens is formed with a predetermined step difference with the partition wall, and a periphery of the lens directly touches a side surface of the partition wall defining the area of the lens;

a color filter layer between the lens and the light-emitting element layer, the color filter layer including:

multiple color filters including a color filter above the light-emitting element, and wherein the color filter layer includes a second partition wall between the color filter and another color filter that overlaps the partition wall and a black matrix on the second partition wall, wherein the black matrix protrudes further than the second partition wall such that a lower surface of the black matrix is exposed, and wherein the color filter contacts the lower surface of the black matrix and directly contacts the adhesive layer, wherein a top surface of the second partition wall has a hydrophobic property and a remaining portion has a hydrophilic property, and wherein a lower part of the partition wall is in contact with the lens, and an upper part of the partition wall is exposed by the lens; and a second substrate between the color filter layer and the lens.

9. The display device of claim 8, wherein a light-emitting element comprises a first electrode, an emission layer placed on the first electrode, and a second electrode placed on the emission layer, and the display device further comprises:

an encapsulation layer formed on the second electrode, wherein the color filter layer is formed above the encapsulation layer.

10. The display device of claim 9, wherein the lens is placed above the color filter layer.

11. The display device of claim 8, wherein the lens is formed by discharging a thermosetting solution with use of an inkjet printing method.

12. A display device comprising:

a substrate on which areas of pixels composed of multiple subpixels are arranged;

a circuit element layer in which circuit elements constituting the multiple subpixels are provided;

a light-emitting element layer in which light-emitting elements constituting the multiple subpixels are provided;

an adhesive layer on the light-emitting element layer;

a lens placed above the light-emitting element layer to correspond to two or more light-emitting elements in a pixel;

a partition wall defining an area of the lens, wherein the lens is formed within the area formed by the partition wall, wherein the lens is formed with a predetermined step difference with the partition wall, and a periphery of the lens directly touches a side surface of the partition wall defining the area of the lens; and a color filter layer between the lens and the light-emitting element layer, the color filter layer including a color filter, wherein the color filter layer includes a second partition wall between the color filter and another color filter, wherein the color filter directly contacts the adhesive layer, wherein a top surface of the second partition wall has a hydrophobic property and a remaining portion has a hydrophilic property, and wherein a lower part of the partition wall is in contact with the lens, and an upper part of the partition wall is exposed by the lens.

13. The display device of claim 12, wherein each light-emitting element in the two or more light-emitting elements comprises:

a first electrode;

an emission layer placed on the first electrode; and a second electrode placed on the emission layer.

14. The display device of claim 13, further comprising:

an encapsulation layer formed on the second electrode.

15. The display device of claim 14, wherein the emission layer is surrounded by a pixel definition film provided with two or more openings for exposing a part of the first electrodes for the two or more light-emitting elements, and the lens is formed on the encapsulation layer in such a manner as to correspond to the two or more openings of the pixel definition film.

16. The display device of claim 12, wherein the two or more light emitting elements include a first light emitting element for a first subpixel, a second light emitting element for a second subpixel, and a third light emitting element for a third subpixel, and wherein the color filter layer includes a first color filter on the first subpixel, a second color filter on the second subpixel, and a third color filter on the third subpixel, and wherein the lens is placed above the light-emitting element layer and the color filter layer to correspond to the first subpixel and the first color filter, the second subpixel and the second color filter, and the third subpixel and the third color filter.

17. The display device of claim 12, wherein the lens is in a convex shape.

18. The display device of claim 12, wherein the surface height of the lens is higher than a surface height of the partition wall.

* * * * *